(12) United States Patent
Hayashi et al.

(10) Patent No.: US 9,812,166 B2
(45) Date of Patent: Nov. 7, 2017

(54) RECORDING AND REPRODUCING DEVICE FOR RECONSTRUCTING USER DATA

(71) Applicant: Hitachi-LG Data Storage, Inc., Tokyo (JP)

(72) Inventors: Hisahiro Hayashi, Tokyo (JP); Norimoto Ichikawa, Tokyo (JP)

(73) Assignee: Hitachi-LG Data Storage, Inc., Tokyo (JP)

( * ) Notice: Subject to any disclaimer, the term of this patent is extended or adjusted under 35 U.S.C. 154(b) by 0 days.

(21) Appl. No.: 15/173,895

(22) Filed: Jun. 6, 2016

(65) Prior Publication Data

US 2016/0372151 A1 Dec. 22, 2016

(30) Foreign Application Priority Data

Jun. 19, 2015 (JP) ................................ 2015-124167

(51) Int. Cl.

| | | |
|---|---|---|
| *G11B 31/00* | (2006.01) | |
| *G11B 20/18* | (2006.01) | |
| *G11B 20/12* | (2006.01) | |
| *G06F 11/14* | (2006.01) | |
| *G11C 29/42* | (2006.01) | |
| *G06F 11/10* | (2006.01) | |

(52) U.S. Cl.
CPC ...... *G11B 20/1833* (2013.01); *G11B 20/1217* (2013.01); *G06F 11/1076* (2013.01); *G06F 11/14* (2013.01); *G06F 11/1402* (2013.01); *G11B 2020/1843* (2013.01); *G11C 29/42* (2013.01)

(58) Field of Classification Search
None
See application file for complete search history.

(56) References Cited

U.S. PATENT DOCUMENTS

| | | | | |
|---|---|---|---|---|
| 4,541,091 A | * | 9/1985 | Nishida .............. | G11B 20/1809 714/704 |
| 2012/0260150 A1 | * | 10/2012 | Cideciyan ........... | G06F 11/1008 714/773 |
| 2013/0080862 A1 | * | 3/2013 | Bennett ............... | G06F 11/1076 714/782 |

(Continued)

FOREIGN PATENT DOCUMENTS

JP 2014-203485 A 10/2014

*Primary Examiner* — Tan X Dinh
(74) *Attorney, Agent, or Firm* — Mattingly & Malur, PC

(57) ABSTRACT

A recording/reproducing device and a recording/reproducing method, which are capable of improving reliability of data while securing compatibility with a file format employed in a recording medium are provided. Provided is a reconstruction method of reproduction data acquired from a reproducing device that reproduces data from a recording medium in which the data is recorded, performs error correction using a second error correction code specified in a file format employed in the recording medium, and outputs reproduction data, and the reconstruction method of the reproduction data includes obtaining reproduction data from the reproducing device, reading a first error correction code different from the second error correction code from the reproduction data, and performing error correction on the reproduction data using the first error correction code and reconstructing user data.

10 Claims, 4 Drawing Sheets

(56) References Cited

U.S. PATENT DOCUMENTS

| | | | |
|---|---|---|---|
| 2015/0149868 A1* | 5/2015 | Earhart | G11B 20/1217 714/768 |
| 2015/0278021 A1* | 10/2015 | Crisan | G06F 11/1076 714/6.24 |
| 2016/0156372 A1* | 6/2016 | Motwani | G06F 11/1076 714/755 |

* cited by examiner

F I G. 5 A
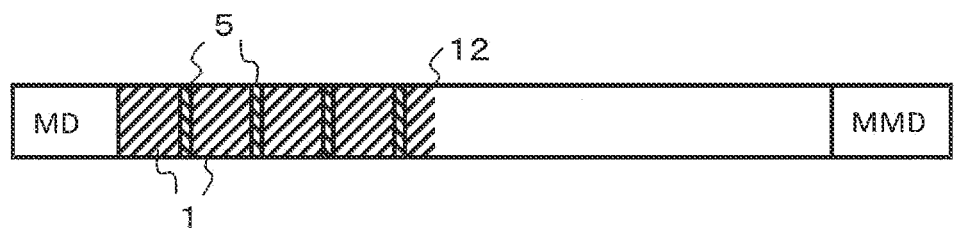
F I G. 5 B
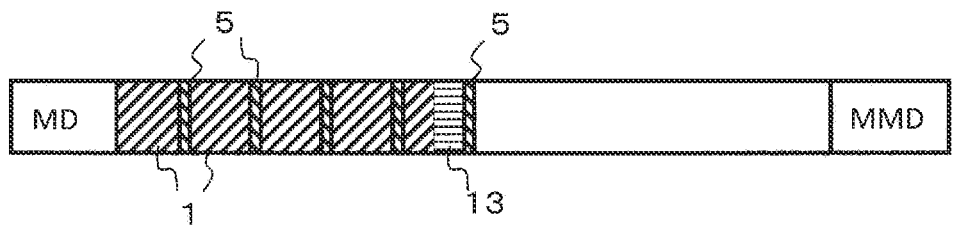
F I G. 5 C
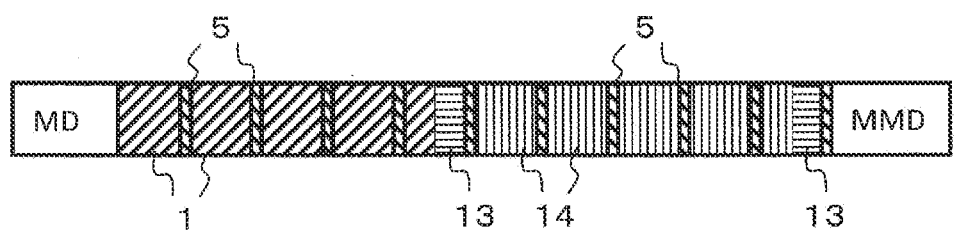

RECORDING AND REPRODUCING DEVICE FOR RECONSTRUCTING USER DATA

TECHNICAL FIELD

The present invention relates to a data recording/reproducing device, a reproduction data reconstruction method, and a write data generation method, and more particularly to data error correction.

BACKGROUND ART

As a background technique of the present technical field, a technique disclosed in JP 2014-203485 A (Patent Document 1) is known. Patent Document 1 discloses a technique in which in an archive system including an archive management device and a library device, when there is a data recording request, the archive management device generates an error correction code to be added to data, calculates a position at which the generated error correction code is recorded in a recording medium, generates data stream in which data and error correction information are arranged so that the generated error correction code is recorded at the calculated error correction code recording position, and transmits the generated data stream to the library device, and the library device receives the data stream, and records the data stream on a recording medium.

CITATION LIST

Patent Document

Patent Document 1: JP 2014-203485 A

SUMMARY OF THE INVENTION

Problems to be Solved by the Invention

In the technique disclosed in Patent Document 1, an archive system and a recording method in which the error correction code is added to data, and thus data is recorded in the recording medium in a form in which reliability of data can be improved, and compatibility of a file format employed in the recording medium can be secured are provided. Further, in the technique disclosed in Patent Document 1, the data to which the error correction code is added is recorded in the recording medium through the library device dedicated for the archive system. However, when this technique is applied to customer recording/reproducing devices, various problems arise. For example, in the archive system, data to be recorded is data that has not been used for a predetermined period of time or data that is low in access frequency in terms of the nature of data, and thus data stored in a buffer for temporary storage is first recorded. For this reason, it is unnecessary to chop and record, and, for example, recording on a recordable optical disc that is in widespread use for customer use is not considered.

It is an object of the present invention to provide a recording/reproducing device, a reproduction data reconstruction method, and a write data generation method, which are capable of recording on a recording medium in a form in which reliability of data can be improved, and compatibility with a file format employed in the recording medium can be secured even when applied to a customer recording/reproducing device.

Solutions to Problems

In order to solve the above problem, according to one aspect, the present invention provides a reconstruction method of reproduction data acquired from a reproducing device that reproduces data from a recording medium in which the data is recorded, performs error correction using a second error correction code specified in a file format employed in the recording medium, and outputs reproduction data, and the reconstruction method of the reproduction data includes obtaining reproduction data from the reproducing device, reading a first error correction code different from the second error correction code from the reproduction data, and performing error correction on the reproduction data using the first error correction code and reconstructing user data.

Effects of the Invention

According to the present invention, it is possible to provide a recording/reproducing device, a reproduction data reconstruction method, and a write data generation method, which are capable of securing compatibility with a file format employed in a recording medium while improving reliability of data.

BRIEF DESCRIPTION OF THE DRAWINGS

FIGS. 5A to 5C are diagrams for describing a recording process on a recordable disc according to a second embodiment.

MODE FOR CARRYING OUT THE INVENTION

Hereinafter, exemplary embodiments of the present invention will be described with reference to the appended drawings.

First Embodiment

Figure 1:
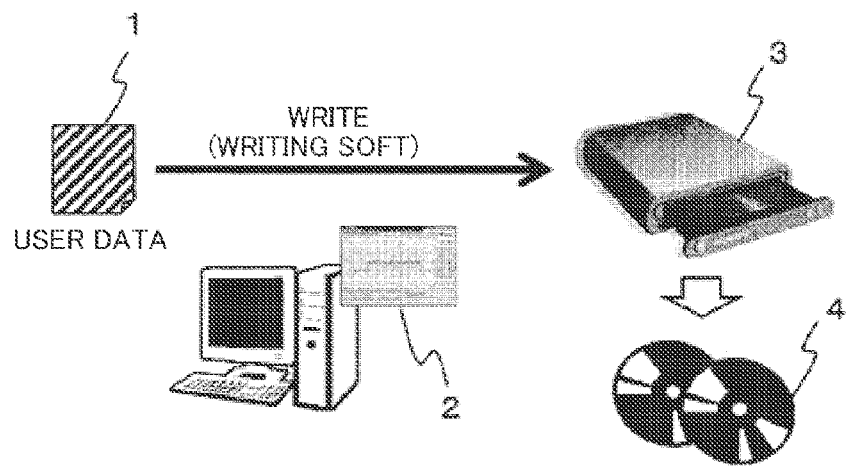
FIG. 1 is a conceptual diagram illustrating data writing according to a first embodiment.

FIG. 1 is a conceptual diagram illustrating data writing according to the present embodiment. In FIG. 1, 1 denotes user data, 2 denotes writing software, 3 denotes an optical disc drive, and 4 denotes an optical disc. The user data 1 is written in the optical disc 4 through an optical disc drive 3 using the writing software 2. At this time, the writing software 2 is writing software that conforms to a file system (for example, UDF) for the optical disc 4, and adds an error correction code (parity) (hereinafter, referred to as a "redundant recovery code (RRC)"). It is possible to create an optical disc including data including the RRC added thereto is added using the writing software 2. A field in which the RRC is recorded is recorded in a format conforming to a non-data field in the file system for the optical disc 4. The writing software 2 is supplied as a form bundled with the optical disc drive 3, and installed and used in, for example, a personal computer to which the optical disc drive 3 is connected as a peripheral device. The RRC is an error correction code separate from an error correction code specified in a recording format serving as a file format employed in the optical disc 4. Thus, another error correction code according to the recording format of the optical disc is finally further added to data obtained by adding the RRC to the user data to be recorded at the optical disc drive and then recorded in the optical disc.

In other words, a first data stream is generated by adding an RRC (a first error correction code) to the user data to be recorded, and the first data stream is transmitted to the optical disc drive side. Then, at the optical disc drive side, a second error correction code according to the recording format of the optical disc is further added and then recorded in the optical disc. The writing software is executed by a higher-level device to which the optical disc drive is connected as the peripheral device.

Figure 2A:
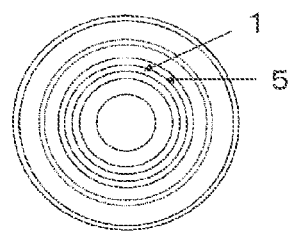
FIGS. 2A and 2B are schematic diagrams for describing a relation between user data and an RRC on an optical disc according to the first embodiment.
Figure 2B:
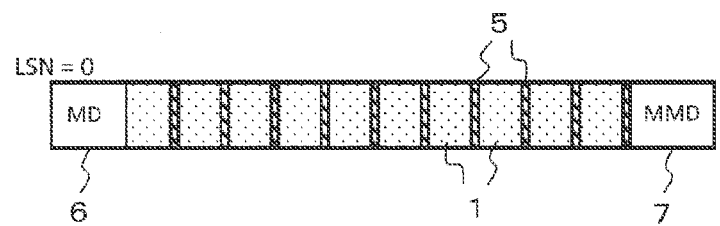

FIGS. 2A and 2B are schematics diagram for describing a relation between user data and an RRC on an optical disc. FIG. 2A is a schematic diagram illustrating an arrangement on an optical disc, and user data 1 and an RRC 5 are recorded on an optical disc in a circumferential direction. In FIG. 2A, the user data 1 and the RRC 5 are recorded concentrically but may be recorded helically.

FIG. 2B is a schematic diagram illustrating a logical arrangement of data, and illustrates a structure that conforms to a format specified in a UDF. In FIG. 2B, LSN=0 at a left end is a logical sector number (LSN) at the head. The LSN indicates a logical position of data on the optical disc. By providing an LSN and a sector value indicating a data length to be accessed to the recording/reproducing device, it is possible to record data to a desired position on the optical disc or read data from a desired position on the optical disc. 6 denotes metadata MD, and information related to a file recorded in the optical disc is described. For example, information indicating whether or not a file has the RRC, the ratio of the RRC to the entire file, information indicating an arrangement position of the RRC on the optical disc, parameter information such as a size, information indicating an arrangement position of each file on the optical disc, information of a directory structure that enables a UDF file system to refer to a file, and information such as a file name, a path, and a size are described. 7 indicates mirror metadata MMD, and the same information as the information of the metadata MD 6 is redundantly recorded to improve reliability.

The RRC 5 is generated using the user data 1 of a predetermined size unit and added to the end of the user data 1 of the predetermined size unit. For example, when the optical disc is a Blu-Ray (a registered trademark) disc, the predetermined size unit and the RRC are set to 1024 MB, the RRC is set to 32 MB, and the ratio of the RRC to the data amount is about 3%. In FIG. 2B, the second error correction code according to the recording format of the optical disc which is finally recorded in the optical disc is omitted.

Figure 3:
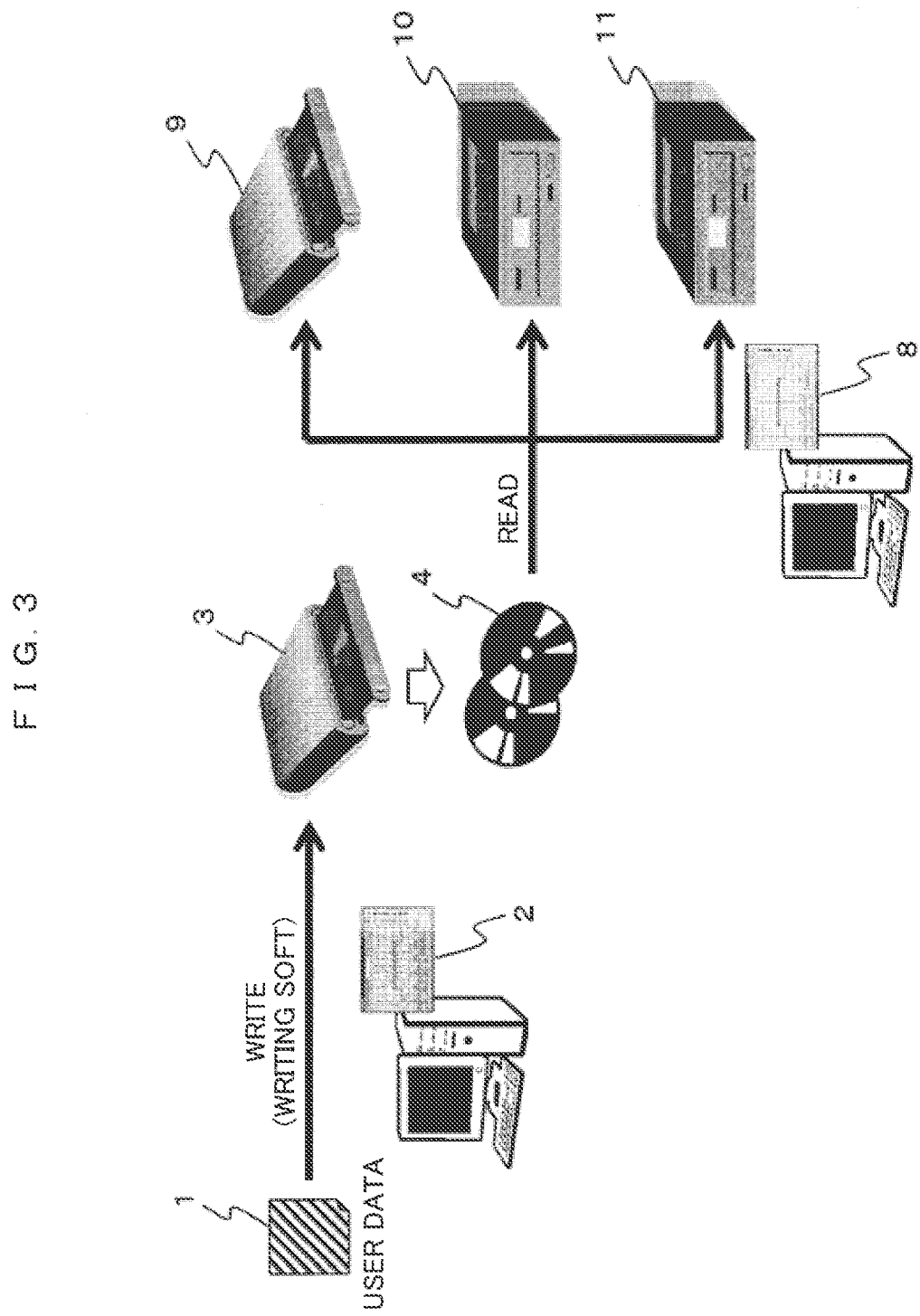
FIG. 3 is a conceptual diagram illustrating data reading according to the first embodiment.

FIG. 3 is a conceptual diagram illustrating data reading according to the present embodiment. In FIG. 3, a left drawing is a configuration diagram illustrating data writing and the same as FIG. 1, and the optical disc 4 in which the data including the RRC added thereto is recorded will be described with reference to a right drawing.

In FIG. 3, three data reading configurations are considered. A first configuration is reproduction by an optical disc drive having an RRC decoding function. In other words, an optical disc drive 9 is a drive configuration such that an RRC decoder is installed in a general-purpose optical disc drive, and it is possible to perform data reconstruction based on the RRC in the optical disc drive 9 without needing a special operation while causing the user not to recognize the RRC. As a specific configuration, the optical disc drive 9 has a configuration of a reproducing device function and includes a reproducing unit such as an optical pick up that reproduces data recorded in the optical disc and generates a reproduction data stream, a decoder that performs a process of decoding a file format employed in the optical disc from the reproduction data stream such as a de-scrambling process or a (second) error correction process, and an error correction unit having an RRC decoding function of reading the RRC (the first error correction code) from the data stream decoded by the decoder, performing error correction on the data stream decoded using the error correction code of the RRC, and reconstructing the user data.

A second configuration is reproduction by an optical disc drive having no RRC decoding function. In other words, the optical disc drive 10 has no RRC decoding function, but data can be reproduced even in the optical disc drive 10 since the data including the RRC added thereto which is recorded in the optical disc 4 conforms to the UDF. Since the RRC is recorded in a non-data field of the UDF and not regarded as data in the UDF file system, conventional data to which no RRC is added is regarded as being recorded and reproduced. Thus, the RRC data reconstruction effect is not obtained, but the reproduction can be performed with equivalent performance to the related art using the error correction code or the like employed in the optical disc of the related art.

A third configuration is reproduction using reading software 8 that reproduces RRC information and performs data reconstruction. In other words, the optical disc drive 11 has no RRC decoding function, similarly to the optical disc drive 10, but the reading software 8 that reproduces RRC information and performs data reconstruction is installed in a personal computer or the like, the optical disc drive 11 is connected to the personal computer or the like as a peripheral device, and data reconstruction based on the RRC can be performed using the reading software 8.

In other words, the optical disc drive 11 reproduces data from the optical disc 4 in which the data is recorded, performs error correction using the second error correction code specified in a file format employed in the optical disc 4, and outputs reproduction data, and the reading software 8 obtains the reproduction data from the optical disc drive 11, reads the RRC serving as the first error correction code different from the second error correction code from the reproduction data, performs error correction on the reproduction data using the RRC, and reconstructs the user data. The reading software 8 is executed by a higher-level device (a personal computer or the like) to which the optical disc drive 11 is connected as a peripheral device.

Figure 4:
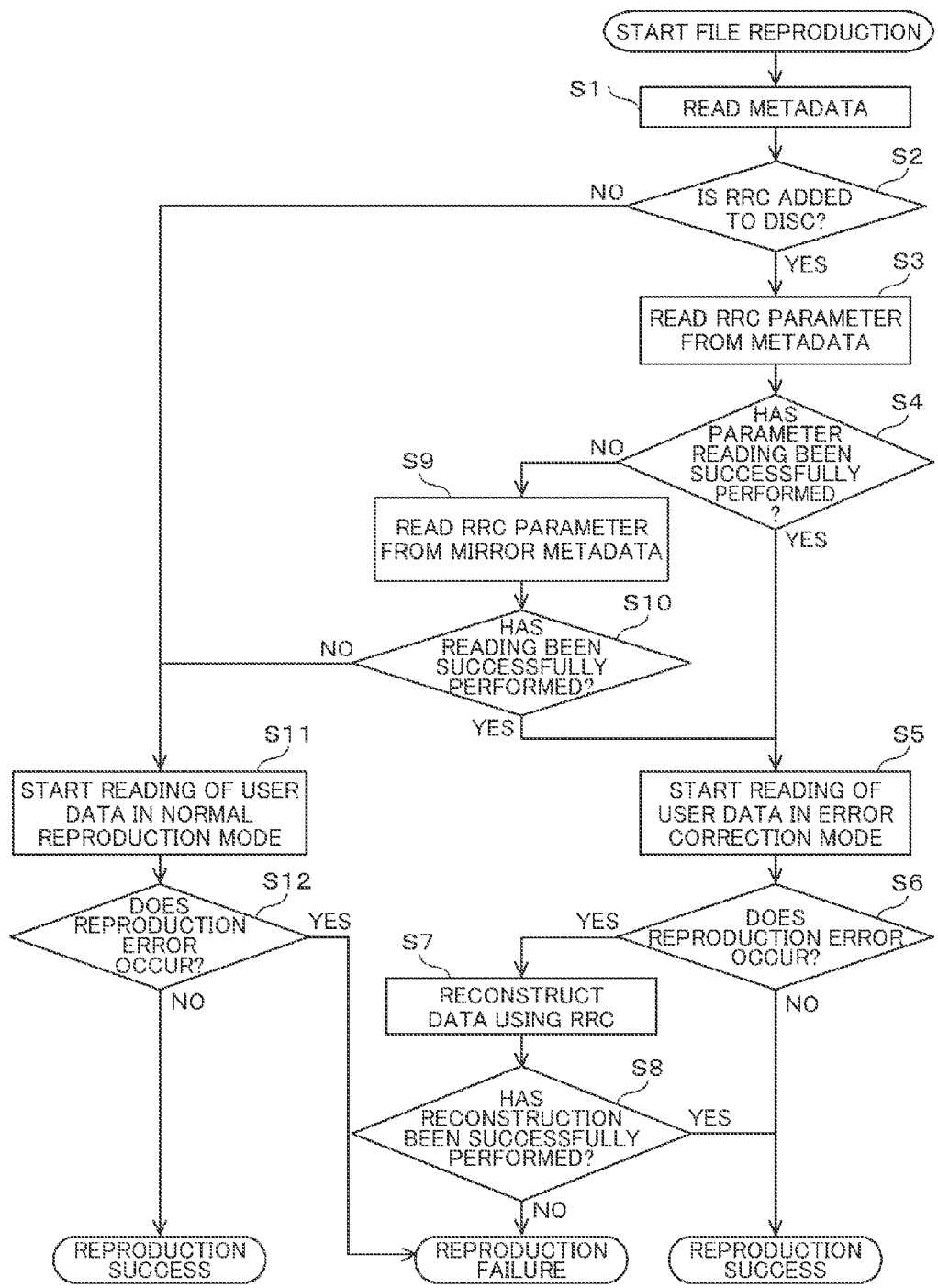
FIG. 4 illustrates a process flow of data reconstruction using RRC information according to the first embodiment.

FIG. 4 illustrates a data reconstruction process flow using the RRC information according to the present embodiment. In FIG. 4, when data reproduction starts, first, in step 1 (S1), the metadata MD is read, and in S2, it is determined whether or not the RRC information is added to a disc. When the RRC information is added, in S3, an RRC parameter is read from the metadata MD, and in S4, it is determined whether or not the parameter has been successfully read. When the parameter has been successfully read, in S5, user data reading starts in an error correction mode in which data reconstruction is performed using the RRC information. In the user data reading in S5, the error correction is performed using the error correction code specified in the recording format employed in the optical disc, but there are cases in which the error correction is disabled, and a reproduction error occurs. In S6, it is determined whether or not the reproduction error has occurred, and when there is no reproduction error, the reproduction is determined to have been successfully performed, and the process ends. When there is a reproduction error, in S7, data reconstruction is performed using the RRC, the process ends when the reconstruction has been successfully performed. When the reconstruction has failed, the reproduction is determined to have failed, a process such as an error display or re-reading is performed. When the RRC parameter reading is determined to have failed in S4, in S9, the RRC parameter is read from the mirror metadata MMD. In S10, it is determined whether or not the parameter has been successfully read. When the parameter has been successfully read, the process proceeds to S5. However, when the parameter has failed to be read, in S11, user data reading starts in a normal reproduction mode using no RRC information. In S12, it is determined whether or not the reproduction error has occurred, and when there is no reproduction error, the reproduction is determined to have been successfully performed, and the process ends. When there is a reproduction error, the reproduction is determined to have failed.

In the present embodiment, the example in which data is recorded in the optical disc 4 has been described, but the recording medium is not necessarily limited to the optical disc, and the recording medium may be a magneto optical disc, a hologram, or the like. The optical disc may be, for example, a Blu-ray disc (BD) or a CD, or a DVD. The optical disc drive may be a recording/reproducing device that performs recording and reproduction on the recording medium.

As described above, the present embodiment provides a reconstruction method of reproduction data acquired from a reproducing device that reproduces data from a recording medium in which the data is recorded, performs error correction using a second error correction code specified in a file format employed in the recording medium, and outputs reproduction data, and the reconstruction method of the reproduction data includes obtaining reproduction data from the reproducing device, reading a first error correction code different from the second error correction code from the reproduction data, and performing error correction on the reproduction data using the first error correction code and reconstructing user data.

A reproducing device that reproduces data from a recording medium includes a reproducing unit that reproduces the data recorded in the recording medium and generates a reproduction data stream, a decoder that performs error correction on the reproduction data stream using a second error correction code specified in a file format employed in the recording medium, and an error correction unit that reads a first error correction code different from the second error correction code from a data stream decoded by the decoder, performs error correction on the decoded data stream using the first error correction code, and reconstructs user data.

A write data generation method of generating write data for a recording device that adds a second error correction code specified in a file format employed in a recording medium and records data in the recording medium includes adding a first error correction code different from the second error correction code to user data to be recorded and generating a first data stream and transmitting the first data stream to the recording device.

Thus, according to the present embodiment, it is possible to provide a recording/reproducing device, a reproduction data reconstruction method, and a write data generation method, which are capable of securing compatibility with a file format employed in a recording medium while improving reliability of data.

Second Embodiment

FIGS. 5A to 5C are diagrams for describing a recording process on a recordable disc according to the present embodiment. FIG. 5A illustrates a state in which the user data is recorded for the first time, and illustrates an example in which a recording terminal of the user data is not recorded up to a data size unit to which the RRC is added. In this case, the RRC is not added to fraction data 12 in which a recording terminal portion of the user data is less than a data size unit to which the RRC is added. For this reason, as illustrated in FIG. 5B, padding data 13 is embedded up to the data size unit to which the RRC is added, and thus the RRC 5 can be added. As described above, when recording is temporarily stopped in the recordable disc, data padding is performed up to the data size unit to which the RRC is added, and thus the RRC can be added to the entire recording data. In other words, when the user data is not divided by a predetermined size with no remainder, a padding process of embedding predetermined data until n times a predetermined size is obtained is performed.

FIG. 5C illustrates an example in which additional recording is performed, and user data 14 is additionally recorded, and data padding is similarly performed when the recording terminal of the user data is not recorded up to the data size unit to which the RRC is added.

Thus, according to the present embodiment, it is possible to provide a recording/reproducing device, a reproduction data reconstruction method, and a write data generation method, which are capable of securing compatibility with a file format employed in a recording medium while improving reliability of data even in the recordable disc.

Third Embodiment

In the present embodiment, an example of performing a process from RRC addition to data reconstruction in the optical disc drive will be described. In the first embodiment, the data writing is performed using the writing software installed in the personal computer or the like. In the present embodiment, an RRC addition function is implemented in the optical disc drive, and the optical disc drive has the RRC decoding function.

As a specific configuration, the optical disc drive according to the present embodiment has the configuration of the optical disc drive 9 described in the first embodiment as a configuration of a reproducing device function, and includes an error correction code adding unit having an RRC addition function of adding the RCC (the first error correction code) to the user data to be recorded and generating a first data stream, an encoder that converts the first data stream into the file format employed in the optical disc, for example, through addition of the second error correction code, the scrambling process, and the like, and generates a second data stream, and a recording unit such as an optical pick up that records the second data stream in the optical disc.

As described above, in the present embodiment, a write data generation method of generating write data for a recording device that records data in a recording medium includes adding a first error correction code to user data to be recorded and generating a first data stream and transmitting the first data stream to the recording device, and the adding of the first error correction code includes generating an error correction code, adding the error correction code to each predetermined size of the user data, and performing padding of embedding predetermined data until n times the predetermined size is obtained when the user data is not divided by the predetermined size with no remainder.

As described above, since the addition of the RRC and the data reconstruction using the RRC can be performed in the optical disc drive, it is possible to use the recording/reproducing device in which reliability of data is improved without need a special operation while causing the user not to recognize the RRC.

The embodiments have been described above, but the present invention is not limited to the above embodiments, and various modified examples are included. The embodiments have been described in detail in order to facilitate understand of the present invention and not limited to the configuration that necessarily includes all the components described above. Some components of a certain embodiment may be replaced with components of another embodiment. Components of another embodiment may be added to components of a certain embodiment. Other components may be added to some components of each embodiment, some components of each embodiment may be deleted, some components of each embodiment may be replaced with other components.

REFERENCE SIGNS LIST 1, 14 user data
2 writing software
3, 9, 10, 11 the optical disc drive
4 the optical disc
5 error correction code (RRC)
6 metadata MD
7 mirror metadata MMD
8 reading software
12 fraction data that is less than data unit to which RRC is added
13 padding data

The invention claimed is:

1. A data reconstruction method of reproducing user data from a recording medium in which the user data is recorded, the user data reconstruction method comprising:
    obtaining data from the recording medium with a reproducing device;
    performing error correction using a second correction code specified in a file format employed in the recording medium on the obtained data to generate reproduction data;
    reading a first error correction code different from the second error correction code from the reproduction data; and
    performing error correction on the reproduction data using the first error correction code and reconstructing the user data,
    wherein the user data and the first error correction code are stored on the recording medium with the first error correction code added to each of a plurality of pieces of the user data, and
    wherein one or more of the pieces of the user data each have a predetermined size and another one of the pieces of the user data is less than the predetermined size, and predetermined data is embedded in the other one of the pieces of user data which is less than the predetermined size until the other one of the pieces of user data with the embedded predetermined data has the predetermined size.

2. The data reconstruction method according to claim 1, wherein the error correction on the reproduction data using the first error correction code is performed when the error correction using the second error correction code specified in the file format employed in the recording medium has failed.

3. The data reconstruction method according to claim 1, wherein reading the first error correction code from the reproduction data, performing the error correction on the reproduction data using the first error correction code, and reconstructing the user data is performed through a software process.

4. The data reconstruction method according to claim 3, wherein the software process is executed by a higher-level device to which the reproducing device is connected as a peripheral device.

5. A reproducing device that reproduces data from a recording medium, comprising:
    a reproducing unit that obtains the data recorded in the recording medium;
    a decoder that performs error correction on the obtained data using a second error correction code specified in a file format employed in the recording medium to generate reproduction data; and
    an error correction unit that reads a first error correction code different from the second error correction code from the reproduction data decoded by the decoder, performs error correction on the decoded data stream using the first error correction code, and reconstructs user data therefrom,
    wherein the user data and the first error correction code are stored on the recording medium with the first error correction code added to each of a plurality of pieces of the user data, and
    wherein one or more of the pieces of the user data each have a predetermined size and another one of the pieces of the user data is less than the predetermined size, and predetermined data is embedded in the other one of the pieces of user data which is less than the predetermined size until the other one of the pieces of user data with the embedded predetermined data has the predetermined size.

6. The reproducing device according to claim 5, wherein the error correction unit performs error correction on the decoded data stream using the first error correction code when the decoder has failed to perform the error correction using the second error correction code specified in the file format employed in the recording medium.

7. A data writing method of writing user data to a recording medium, the data writing method comprising:
    adding a first error correction code to the user data;
    further adding a second error correction code different from the first error correction code to the user data according to a file format employed in the recording medium to generate write data; and
    writing the write data to the recording medium,
    wherein the user data is a plurality of pieces of user data where one or more of the pieces of the user data each have a predetermined size and another one of the pieces of the user data is less than the predetermined size, and
    wherein the adding of the first error correction code includes performing padding of embedding predetermined data in the other one of the pieces of user data which is less than the predetermined size until the other one of the pieces of user data with the embedded predetermined data has the predetermined size, and adding the first error correction code to each of the pieces of the user data.

8. The data writing method according to claim 7, wherein the adding of the first error correction code to the user data, and transmitting a result thereof to a recording device which writes the data to the recording medium is performed through a software process.

9. The write data generation method according to claim 8, wherein the software process is executed by a higher-level device to which the recording device is connected as a peripheral device.

10. The data writing method according to claim 7, wherein the pieces of user data, including the embedded predetermined data, divided by the predetermined size has no remainder.

* * * * *